(12) United States Patent
Atyunin et al.

(10) Patent No.: US 7,026,850 B2
(45) Date of Patent: Apr. 11, 2006

(54) PROGRAMMABLE SELF-CALIBRATING VERNIER AND METHOD

(75) Inventors: Vasily Grigorievich Atyunin, St. Petersburg (RU); Alexander Roger Deas, Edinburgh (GB)

(73) Assignee: Acuid Corporation Limited, St. Peter Port (*) Notice: Subject to any disclaimer, the term of this patent is extended or adjusted under 35 U.S.C. 154(b) by 290 days.

(21) Appl. No.: 10/151,185

(22) Filed: May 21, 2002

(65) Prior Publication Data

US 2002/0196061 A1   Dec. 26, 2002

Related U.S. Application Data

(60) Provisional application No. 60/293,053, filed on May 21, 2001.

(51) Int. Cl.
*H03L 7/06* (2006.01)

(52) U.S. Cl. .................................. 327/158; 327/153

(58) Field of Classification Search ................ 327/156, 327/158, 161, 147, 149, 152, 153, 141
See application file for complete search history.

(56) References Cited

U.S. PATENT DOCUMENTS

| | | | | |
|---|---|---|---|---|
| 4,868,522 A | * | 9/1989 | Popat et al. | 331/2 |
| 4,922,141 A | * | 5/1990 | Lofgren et al. | 327/158 |
| 5,003,562 A | * | 3/1991 | van Driest et al. | 375/327 |
| 5,252,867 A | | 10/1993 | Sorrells et al. | 307/606 |
| 5,270,666 A | * | 12/1993 | Rapeli et al. | 329/341 |
| 5,374,860 A | * | 12/1994 | Llewellyn | 327/276 |
| 5,451,894 A | * | 9/1995 | Guo | 327/241 |
| 5,719,515 A | * | 2/1998 | Danger | 327/270 |
| 5,878,097 A | * | 3/1999 | Hase et al. | 375/371 |
| 5,920,518 A | | 7/1999 | Harrison et al. | 365/233 |
| 5,963,074 A | | 10/1999 | Arkin | 327/276 |
| 5,994,938 A | | 11/1999 | Lesmeister | 327/277 |
| 6,011,732 A | * | 1/2000 | Harrison et al. | 365/194 |
| 6,092,030 A | | 7/2000 | Lepejian et al. | 702/79 |
| 6,100,735 A | * | 8/2000 | Lu | 327/158 |
| 6,104,223 A | | 8/2000 | Chapman et al. | 327/276 |
| 6,119,242 A | * | 9/2000 | Harrison | 713/503 |
| 6,194,928 B1 | | 2/2001 | Heyne | 327/152 |
| 6,437,713 B1 | * | 8/2002 | Lesea | 341/78 |
| 6,441,659 B1 | * | 8/2002 | Demone | 327/156 |
| 6,484,268 B1 | * | 11/2002 | Tamura et al. | 713/600 |
| 6,492,851 B1 | * | 12/2002 | Watarai | 327/158 |

FOREIGN PATENT DOCUMENTS

EP   0306662   3/1989

* cited by examiner

*Primary Examiner*—Timothy Callahan
*Assistant Examiner*—Cassadra Cox
(74) *Attorney, Agent, or Firm*—Sughrue Mion, PLLC

(57) ABSTRACT

The present invention relates in general to the field of generation of precise electrical signals, in particular, to a technique for providing accurate delays of signals using a controllable delay line, and is applicable to the areas of high speed communication and memory testing equipment. According to the present invention, an auxiliary reference channel having a delay line which is identical to the main delay line is incorporated into vernier silicon die to allow automatic adjustment of the delay in the main delay line using a reference periodical signal applied to the auxiliary delay line.

6 Claims, 3 Drawing Sheets

PROGRAMMABLE SELF-CALIBRATING VERNIER AND METHOD

This application claims benefit to Provisional Application No. 60/293,053 filed May 21, 2001, the disclosure of which is incorporated herein by reference.

BACKGROUND OF THE INVENTION

1. Field of the Invention

The present invention relates in general to the field of generation of precise electrical signals, in particular, to a technique for providing accurate delay of signals using a controllable delay line, and is applicable to the areas of high speed communication and memory testing equipment.

2. Background Art

As the transmission rate of the data communication signals in modern electronic systems continues to increase, new circuitry and methods are needed to accurately clock command data and create precise controllable delays because it is often desired to delay signals at time intervals much shorter than one period of the master oscillator. For example, the master oscillator might have a frequency of 100 MHz. Such an oscillator has a period of 10 nsec. However, the communication link might have a data rate of 2 Gbits per second. Thus, it may be required to place timing edges with an accuracy of 50 psec and even higher.

This is typically implemented by using a delay line to form a timing vernier as is shown in the prior art, e.g. in U.S. Pat. No. 5,963,074. According to this procedure, a signal passes through the delay line which has taps spaced closely apart in time. By selecting the appropriate taps several signals with intermediate timing can be generated. The system can include a programmable encoder, so that each selectable delay can be separately calibrated.

Known are programmable phase shifters for phase shifting a periodic input signal by an adjustable phase angle to produce an output signal, such as described in U.S. Pat. No. 5,994,938. The phase angle is controlled by, for example, 10-bit input control data. The phase shifter includes a tapped delay line formed by a set of differential or single-ended buffers connected in series for successively delaying the input signal to produce a set of "tap" signals at the buffer outputs.

A programmable phase shifter disclosed in U.S. Pat. No. 6,104,223 includes a tapped delay line, a multiplexer, a programmable delay circuit and, additionally, a programmable data converter which converts input data for controlling multiplexer selection and the amount of delay provided by the programmable delay circuit.

However, as integrated circuit technology has progressed and demanded higher speed, more accurate and more complicated communication equipment, a problem arises to be applied to the timing vernier circuitry is that logic propagation delays are dependent upon the power supply voltage and the temperature of the silicon substrate.

Though the supply voltage sensitivity can be managed to some extent by very tightly regulating the supply voltage, this adds cost to the test system, and also the temperature of the substrate is much more difficult to control.

Additionally, the problem of variable environmental parameters can be solved as suggested in U.S. Pat. No. 6,092,030, when the effect of the significant environmental variables is measured and an adjustment made to the delay circuitry to compensate for the changes in the environmental variable is stored in a memory. Circuitry is designed into the integrated circuit that will measure the appropriate environmental variable or variables. The results of the measurement are used to adjust the delay so that the timing edges are in the correct location with respect to the master oscillator.

When the various delays provided by a programmable delay circuit are adjustable, the phase shifter can be calibrated by measuring the phase shift and adjusting the delay provided by programmable delay circuit. However, the above technical solution requires continuous monitoring and updating compensation values and also frequent re-calibration of adjustment coefficients to provide accurate timing which is a costly and time consuming operation affecting timing accuracy.

It is therefore an object of the present invention to provide a system and method for supplying accurate and constant time delays which do not depend on such environment parameters as temperature variations and supply voltage fluctuations and do not require continuous update, but allows for simple and cost-effective maintenance.

BRIEF SUMMARY OF THE INVENTION

According to a preferred embodiment of the present invention, an auxiliary reference channel having a delay line which is identical to the main delay line is incorporated into vernier silicon die to allow automatic adjustment of the delay in the main delay line using a reference periodical signal applied to the auxiliary delay line. The delayed signal may be periodic or non-periodic in nature.

According to the invention, a vernier is provided for delaying an input signal with a controllable delay to produce an output signal, the vernier having an input terminal for receiving said input main signal and output terminal at which a delayed output signal is generated, wherein the vernier comprises:

a first tapped delay line for delaying the input main signal by an adjustable delay time to produce a plurality of first tapped delayed signals, the delay between said tapped signals being adjusted by the magnitude of a BIAS signal, said first tapped delay line comprising N delays connected to a first multiplexer for selecting one of the plurality of said tapped signals in response to a control input signal, to provide said delayed output signal, an auxiliary second tapped delay line similar in construction to the first tapped delay line, for delaying a periodic reference signal by an adjustable delay time which is adjusted by a BIAS signal to be equal substantially to a period value or an integer number of period values of the reference signal, to produce a delayed reference signal, and a feedback loop for producing said BIAS signal with a magnitude that depends on a phase difference between said input reference signal and a delayed reference signal, so as to compensate for the temperature and supply voltage variations in said vernier.

Preferably, said tapped delay line comprises a set of identical differential or single-ended buffers. Preferably also, but not necessary, the number of buffers in said second tapped delay line is equal to the number N of buffers in the first tapped delay line.

Preferably, the feedback loop comprises a phase detector and a low pass filter.

Preferably, the vernier further comprises a second multiplexer identical to the first multiplexer and connected to the second tapped delay line, for providing a load equivalent to the load of the first multiplexer. The second multiplexer may be controlled by the same control signal as the first multiplexer, or a separate control signal may be supplied to the second multiplexer.

An exemplary embodiment of the invention is further described in more detail by way of the attached drawings.

DETAILED DESCRIPTION OF THE INVENTION

A specialist of ordinary skill in the art will realize that the following description of the present invention is illustrative only and not in any way limiting.

Figure 1:
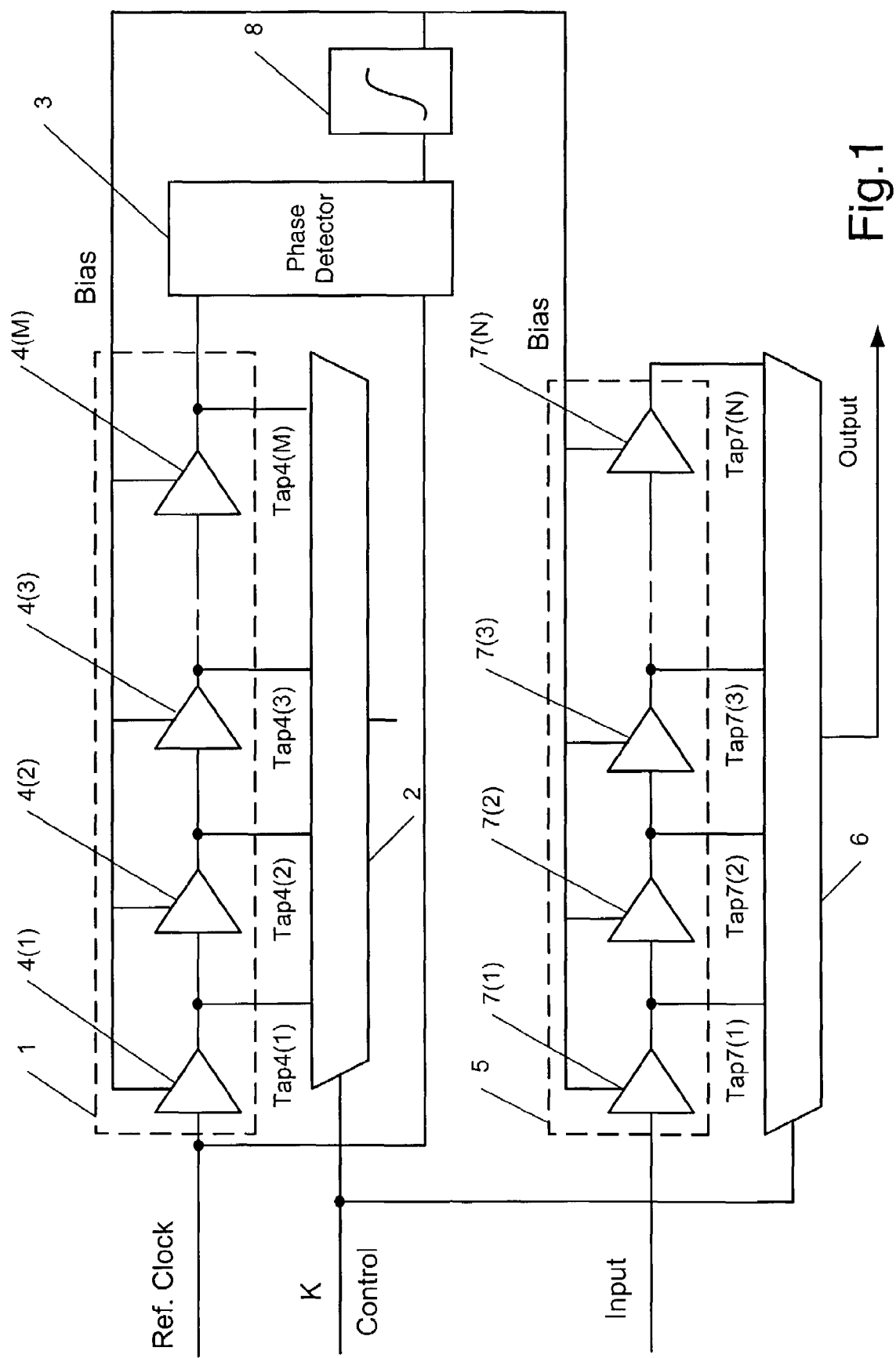
FIG. 1 is a schematic diagram of an exemplary embodiment of a timing delay vernier according to the invention.

In FIG. 1 an example block diagram of a self-calibrating programmable vernier using a plurality of delay lines is shown. A chain 5 of delay elements 7(1)–7(N) with a multiplexer 6, which can be implemented as a set of pass-through transistors with appropriate decoder, is used to delay an input signal for a predetermined time interval which is set by control line. The delays may be implemented in, e.g. CMOS buffers with capacitive load. Typical delay circuit topologies are discussed in detail by Mark Horowitz, Chih-Kong Ken Yang and Stefanos Sidiropoulos, in High Speed Electrical Signalling: Overview and Limitations (IV. Synchronization Circuits), Computer Systems Laboratory, Stanford University, Stanford, Calif. 94305, 1998.

An auxiliary delay circuit 1 is incorporated in the same silicon die to allow the most accurate maintenance of the delay interval, which is sensitive to process, temperature and voltage fluctuations. The auxiliary delay is loaded by a similar multiplexer 2 with the same control data to provide a load identical to the main delay line 5.

The vernier includes a first tapped delay line 5 formed by a chain of differential or single-ended buffers 7(1)–7(N) connected in series for successively delaying the $T_{input}$ signal to produce a set of N "tap" signals Tap7(1)–Tap7(N) at the buffer outputs. N may be any value larger than 1 and is determined by the number of buffers forming delay line 5. In the example illustrated in FIG. 1, N is 16. Each successive tap signal Tap7(1)–Tap7(N) is delayed from its preceding tap signal by the inherent delay of a buffer 7. Multiplexer 6 selects one of its input signals Tap7(1)–Tap7(N) and provides it as an output signal $T_{output}$.

To avoid variation in buffer delay due to supply voltage fluctuations, process or environmental differences between the buffers, the auxiliary tapped delay line 1 is provided.

The auxiliary tapped delay line 1 is formed by a set of differential or single-ended buffers 4(1)–4(M) identical to the buffers 7(1)–7(N) and is connected in series for successively delaying the reference clock signal to produce a set of signals Tap4(1)–Tap4(M) at the buffer outputs. M may be any value larger than 1 and is determined by the number of buffers forming delay line 1. In the example illustrated in FIG. 1, M is equal N. Each successive tap signal Tap4(1)–Tap4(M) is delayed from its preceding tap signal by the inherent delay of a buffer 4.

Reference clock signal having a period of $T_o$ and the same reference signal delayed by an auxiliary delay line 1 (Tap4M) are applied as input to a conventional phase detector 3 that provides a BIAS signal which, after being filtered in a low pass filter 8, is supplied to each buffer 4 and, similar, each buffer 7. The BIAS signal controls the inherent delay of each buffer 4 and 7.

Phase detector 3 adjusts the BIAS signal so that the Tap4M signal is phase locked to the input reference clock signal. Thus, the total delay between the reference clock signal and Tap4M is equal to the period $T_o$. Therefore, when all buffers 4(1)–4(M) are identical, each buffer's delay is substantially equal to $T_0/M$. The tap signals Tap4(1)–Tap4(M) are loaded to multiplexer 2 which is identical to multiplexer 6.

Since each main buffer element is identical to each of the auxiliary buffer elements having the similar load and is controlled by the same BIAS, each buffer delay 7(1)–7(N) is substantially equal to $T_0/M$ as well.

The system in FIG. 1 operates as follows.

The vernier is supplied with a precise reference clock having low jitter, e.g. from a crystal clock oscillator from Brookdale Frequency Controls (25 ppm frequency stability of a 100 MHz oscillator means 0.25 ps accuracy). An arbitrary signal having period $T_{input}$ is applied to the input of the vernier. In case of M identical delay elements, $T_{input} = MT_i$, where Ti is the delay of each delay element. The input signal will be delayed by a time interval $T_d$ defined by a control data line plus the inherent delay of the multiplexer 6, i.e. $T_d = KT_o/M + T_{MUX}$, where K is supplied by the control line. Assuming $T_{mux}$ is negligible comparing to the total delay, $Td = KT_0/M$.

Suppose, the die temperature is increasing, so that the delay of each delay element is increasing too. This causes the feedback circuitry to change BIAS to compensate for the increasing delay in order to keep phases of signals $T_o$ and Tap4(M) synchronised. At the same time, the changing BIAS supplied to the main delay line 5 adjusts delays provided by each of the buffers 7(1)–7(N), thereby maintaining the resulting signal delay constant.

To the contrary, when the temperature of the die is lowering, the delays of each buffer element are decreasing, that causes feedback to change the BIAS signal so as to keep signals To and Tap4(M) at the same level, and similarly to adjust delays of the buffers 7(1)–7(N), thereby maintaining the resulting signal delay at a constant level.

Similar mechanism is applied in case of supply voltage fluctuations.

When the supply voltage is reduced, the delay of each of the delay elements 4(1)–4(M) increase, thereby causing feedback circuit to change BIAS so as to compensate the increase of delays and keep the signals at the same level. The same mechanism is applicable when the supply voltage at the input of the vernier rises. Thus, the claimed apparatus provides a steady-state delays compensated for temperature and supply voltage variations thus eliminating calibration operations that are required in the known prior art solutions.

Figure 2:
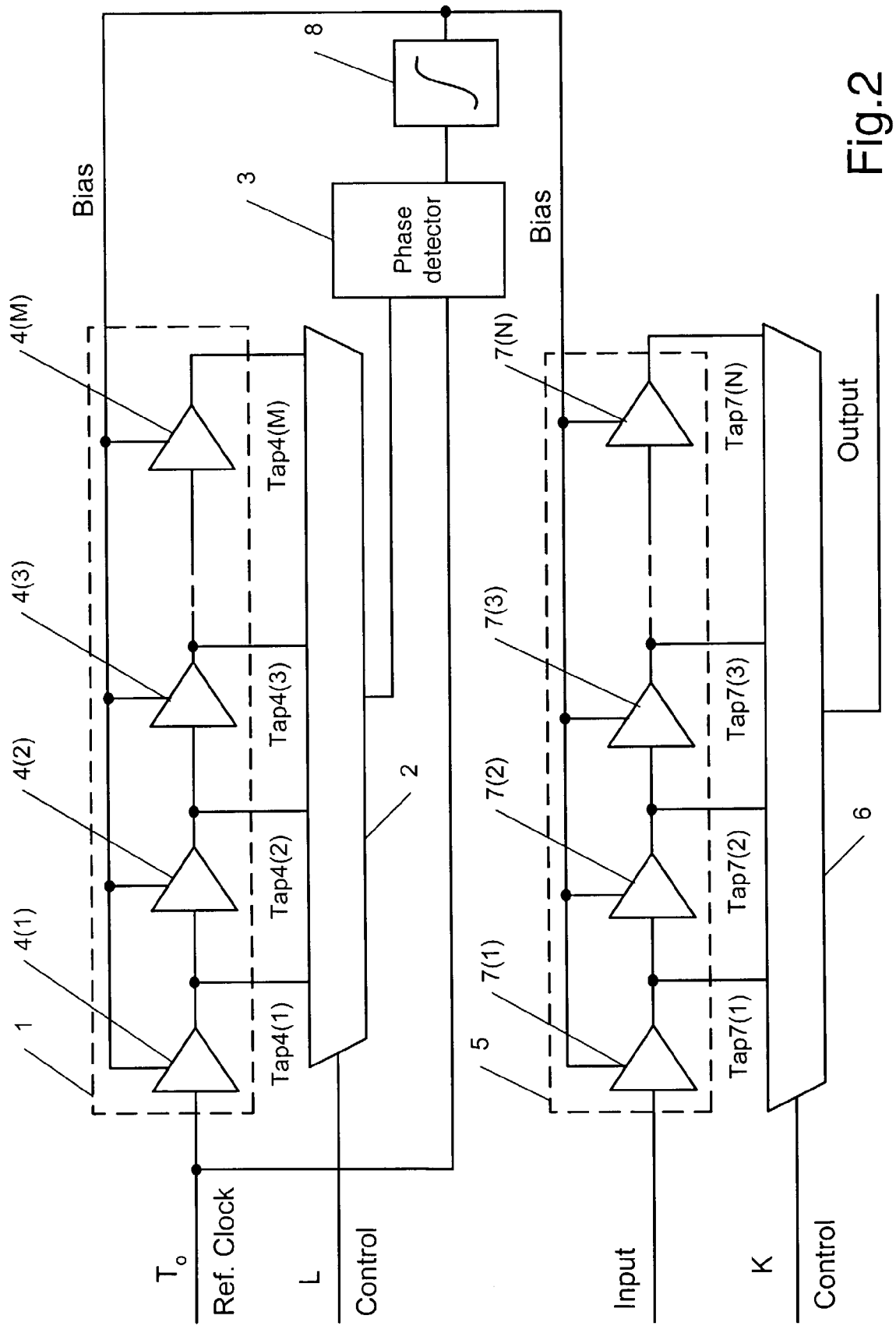
FIG. 2 is a schematic diagram of a second exemplary embodiment of the timing delay vernier according to the invention.

In accordance with the second embodiment of the present invention shown in FIG. 2, the auxiliary multiplexer 2 is controlled by a separate controlling signal L and the output of the multiplexer 2 is input to a phase detector 3. The output of the phase detector 3 after filtering in a low pass filter 8 is used to bias the main delay line 5 and auxiliary delay line 1 to compensate for temperature and supply voltage fluctuations as described above in connection with the embodiment of FIG. 1 of the invention.

According to this interconnection, the multiplexer 2 provides a load equivalent to the load of the multiplexer 6. Also, in this embodiment, the total delay between a reference clock signal arriving at the input of delay element 4(1) and a signal at the output of the multiplexer will include the delay of each delay element 4 through which it passes to become the selected Tap(M) signal, and the inherent delay of multiplexer 2 in passing the selected Tap(M) signal. Thus, in this case, $T_d=KT_i$, (assuming $T_M$ is negligible comparing to the total delay), where K is the number of delay elements selected by the multiplexer. As far as the total delay is defined as $T_O=MT_i$ (assuming L=M), the resulting $T_d=KT_O/M$.

Thus, it becomes possible to provide such a delay of the auxiliary delay line 1 that is required to compensate for the temperature and supply voltage variations in the main line.

In case L≠M, the amount of the delay $T_i$ provided by each delay element can be determined as $T_O/L$, where L is M, M−1, M−2 and so on, while L is not more than M, and the total delay provided by the delay line 1 will be:

$$T_d = \frac{T_o \cdot K}{L}$$

Figure 3:
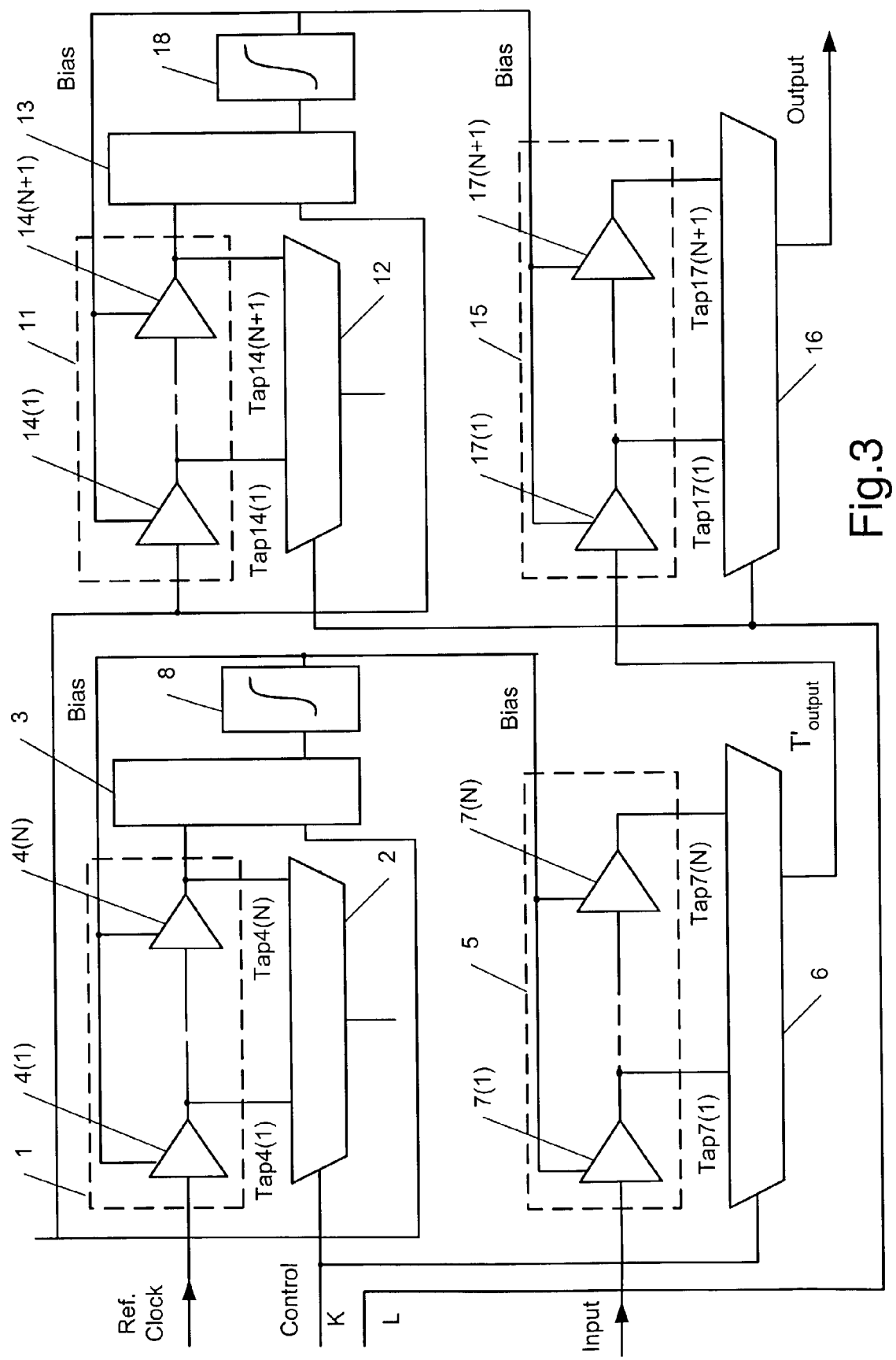
FIG. 3 shows a schematic diagram of a third exemplary embodiment with two verniers according to the invention connected in series so as to form a nonius.

According to the third example embodiment of the present invention shown in FIG. 3, to increase the resolution in defining delay $T_d$, two self-calibrating verniers are connected in series in a nonius-like manner, with the number of delay elements in the first and the second verniers differing in one element.

As shown in FIG. 3, the reference clock is supplied both to the first vernier consisting of a main circuit comprising a delay line 5 and a multiplexer 6 and an auxiliary circuit comprising delay line 1, multiplexer 2, phase detector 3 and low pass filter 8, and to the second vernier consisting of a main circuit comprising delay line 15 and multiplexer 16 and an auxiliary circuit comprising delay line 11, multiplexer 12, phase detector 13 and low pass filter 18. If the number of delays 4(1)–4(N) of the first vernier is N, then the number of delays in the second vernier will be N+1 (or, N−1).

The system in FIG. 3 operates as follows.

Both verniers are supplied with a precise reference clock having low jitter. A reference signal having period $T_0$ is applied to reference inputs of both verniers. In case all the delay elements are identical, $T_i=T_o/N$, where Ti is a delay value of each delay element 7(1)–7(N) of the main delay line 5 and auxiliary delay line 1 of the first vernier, and $T_j=T_o/(N+1)$, where $T_j$ is the delay of each delay element of the main delay line 11 and the auxiliary delay line 15 of the second vernier.

The input signal will be delayed by a time interval $T_d$ defined by control data as follows: $T_d=kT_o/N+LT_o/(N+1)$, where k and L are supplied by the control lines K and L, respectively. Thus, the delay resolution is $T_o/(N(N+1))$, i.e. much smaller than in the embodiments of FIGS. 1 and 2.

Suppose, the die temperature is increasing, so that the delay of each delay element is increasing too. This causes the feedback circuitry to change BIAS to compensate for the increasing delay in order to keep phases of signals $T_o$ and Tap4(N) and, respectively, $T_0$ and Tap4(N+1), synchronised. At the same time, the changing BIAS supplied to the main delay lines 5 and 15 adjusts delays provided by each of the buffers 7(1)–7(N), 17(1)–17(N+1), thereby maintaining the resulting signal delay $T_d$ constant.

To the contrary, when the temperature of the die is lowering, the delays of each buffer element are decreasing, that causes feedback circuitry 3, 8 and 13, 18 to change BIAS signals so as to keep signals $T_o$ and Tap4(N) and Tap14(N+1) at the same level, and similarly to adjust delays of the buffers 7(1)–7(N) and 17(1)–17(N+1), thereby maintaining the resulting signal at a constant level.

Similar mechanism is applied in case of supply voltage fluctuations.

The above technical solution may be applied to the communication equipment or ATE to maintain the precise controllable signal delay to be independent from the ambient temperature and supply voltage fluctuations.

While the forgoing specification has described preferred embodiment(s) of the present invention, one skilled in the art may make many modifications to the preferred embodiment without departing from the invention in its broader aspects. Thus, for example, other compensation circuits may be used to provide a similar conditions for both the main and auxiliary delay lines.

The appended claims therefore are intended to cover all such modifications as fall within the true scope and spirit of the invention.

We claim:

1. A vernier for delaying an input main signal with an adjustable delay, the vernier having an input terminal for receiving said input main signal and output terminal at which a delayed output signal is provided, wherein the vernier comprises:
   a first tapped delay line for delaying the input main signal by an adjustable delay time to produce a plurality of first tapped signals, the delay between said tapped signals being adjusted by the magnitude of a BIAS signal, said first tapped delay line comprising N delays connected to a first multiplexer for selecting one of the plurality of said tapped delayed signals in response to a control input signal, to provide said delayed output signal,
   an auxiliary second tapped delay line, for delaying a periodic reference signal by an adjustable delay time which is adjusted by the BIAS signal and is equal substantially to a period value or an integer number of period values of the reference signal, to produce a delayed reference signal, and
   a feedback loop for producing said BIAS signal with a magnitude depending on a phase difference between said input reference signal and a delayed reference signal, so as to compensate for the temperature and supply voltage variations in said vernier,
   wherein the feedback loop comprises a phase detector,
   wherein the feedback loop further comprises a low pass filter.

2. A vernier for delaying an input main signal with an adjustable delay, the vernier having an input terminal for receiving said input main signal and output terminal at which a delayed output signal is provided, wherein the vernier comprises:
   a first tapped delay line for delaying the input main signal by an adjustable delay time to produce a plurality of first tapped signals, the delay between said tapped signals being adjusted by the magnitude of a BIAS signal, said first tapped delay line comprising N delays connected to a first multiplexer for selecting one of the plurality of said tapped delayed signals in response to a control input signal, to provide said delayed output signal,
   an auxiliary second tapped delay line, for delaying a periodic reference signal by an adjustable delay time which is adjusted by the BIAS signal and is equal substantially to a period value or an integer number of period values of the reference signal, to produce a delayed reference signal, and a feedback loop for producing said BIAS signal with a magnitude depending on a phase difference between said input reference signal and a delayed reference signal, so as to compensate for the temperature and supply voltage variations in said vernier, further comprising a second multiplexer identical to the first multiplexer and connected to the second tapped delay line, and wherein the second multiplexer is controlled by the same control signal as the first multiplexer.

3. A vernier for delaying an input main signal with an adjustable delay, the vernier having an input terminal for receiving said input main signal and output terminal at which a delayed output signal is provided, wherein the vernier comprises:

a first tapped delay line for delaying the input main signal by an adjustable delay time to produce a plurality of first tapped signals, the delay between said tapped signals being adjusted by the magnitude of a BIAS signal, said first tapped delay line comprising N delays connected to a first multiplexer for selecting one of the plurality of said tapped delayed signals in response to a control input signal, to provide said delayed output signal, an auxiliary second tapped delay line, for delaying a periodic reference signal by an adjustable delay time which is adjusted by the BIAS signal and is equal substantially to a period value or an integer number of period values of the reference signal, to produce a delayed reference signal, and a feedback loop for producing said BIAS signal with a magnitude depending on a phase difference between said input reference signal and a delayed reference signal, so as to compensate for the temperature and supply voltage variations in said vernier, further comprising a second multiplexer identical to the first multiplexer and connected to the second tapped delay line, wherein the second multiplexer is controlled by a second control signal.

4. A vernier for delaying an input main signal with an adjustable delay, the vernier having an input terminal for receiving said input main signal and output terminal at which a delayed output signal is provided, wherein the vernier comprises:

a first tapped delay line for delaying the input main signal by an adjustable delay time to produce a plurality of first tapped signals, the delay between said tapped signals being adjusted by the magnitude of a BIAS signal, said first tapped delay line comprising N delays connected to a first multiplexer for selecting one of the plurality of said tapped delayed signals in response to a control input signal, to provide said delayed output signal, an auxiliary second tapped delay line, for delaying a periodic reference signal by an adjustable delay time which is adjusted by the BIAS signal and is equal substantially to a period value or an integer number of period values of the reference signal, to produce a delayed reference signal, and a feedback loop for producing said BIAS signal with a magnitude depending on a phase difference between said input reference signal and a delayed reference signal, so as to compensate for the temperature and supply voltage variations in said vernier, further comprising:

a third tapped delay line for delaying the main signal outputted from the first tapped delay line by an adjustable delay time to produce a plurality of third tap signals distributed in phase that is controlled by a magnitude of a second BIAS signal, said third tapped delay line comprising N+1 delays connected to a third multiplexer for selecting one of the plurality of said third tap delayed signals in response to a second control input signal L, to provide a delayed output signal, an auxiliary fourth tapped delay line comprising N+1 delays, for delaying the periodic reference signal by an adjustable delay time which is controlled by the second BIAS signal and is equal substantially to a period value or an integer number of period values of the reference signal, to produce a second output delayed reference signal, and a second feedback loop for receiving said second delayed reference signal and said second control signal and providing to the third and the fourth tapped delay lines said second BIAS signal.

5. The vernier in accordance with claim 4 wherein the phase shift $T_d$ between said output signal and said periodic reference signal $T_0$ is a function of a value of said control data K and said control data L as follows $T_d = KT_0/N + LT_0/(N+1)$, where K and L are supplied by control lines K and L, respectively.

6. A vernier for delaying an input main signal with an adjustable delay, the vernier having an input terminal for receiving said input main signal and output terminal at which a delayed output signal is provided, wherein the vernier comprises:

a first tapped delay line for delaying the input main signal by an adjustable delay time to produce a plurality of first tapped signals, the delay between said tapped signals being adjusted by the magnitude of a BIAS signal, said first tapped delay line comprising N delays connected to a first multiplexer for selecting one of the plurality of said tapped delayed signals in response to a control input signal, to provide said delayed output signal, an auxiliary second tapped delay line identical to the first tapped delay means, for delaying a periodic reference signal by an adjustable delay time which is adjusted by the BIAS signal and is equal substantially to a period value or an integer number of period values of the reference signal, to produce a delayed reference signal, and a feedback loop for producing said BIAS signal with a magnitude depending on a phase difference between said input reference signal and a delayed reference signal, so as to compensate for the temperature and supply voltage variations in said vernier, a second multiplexer connected to the second tapped delay line, wherein the number of buffers in said second tapped delay line is equal to the number N of buffers in the first tapped delay line, and the second multiplexer is controlled by the same control signal as the first multiplexer.

* * * * *